(12) United States Patent
Byun

(10) Patent No.: US 8,699,649 B2
(45) Date of Patent: Apr. 15, 2014

(54) CLOCK AND DATA RECOVERY CIRCUIT

(75) Inventor: Sang Jin Byun, Seoul (KR)

(73) Assignee: Dongguk University Industry-Academic Cooperation Foundation, Seoul (KR)

(*) Notice: Subject to any disclaimer, the term of this patent is extended or adjusted under 35 U.S.C. 154(b) by 135 days.

(21) Appl. No.: 13/347,056

(22) Filed: Jan. 10, 2012

(65) Prior Publication Data

US 2012/0106689 A1 May 3, 2012

Related U.S. Application Data

(63) Continuation of application No. PCT/KR2010/005876, filed on Aug. 31, 2010.

(30) Foreign Application Priority Data

Aug. 31, 2009 (KR) .................. 10-2009-0080889

(51) Int. Cl.
  *H03D 3/24* (2006.01)
(52) U.S. Cl.
  USPC .......... 375/374; 375/358; 375/362; 375/37; 375/373; 375/375; 375/376
(58) Field of Classification Search
  USPC .......... 375/374, 375, 376, 371, 373; 327/141; 358/490; 370/503; 709/248; 714/12
  See application file for complete search history.

(56) References Cited

U.S. PATENT DOCUMENTS

| 6,211,741 | B1 | 4/2001 | Dalmia | |
|---|---|---|---|---|
| 7,167,037 | B2* | 1/2007 | Rodgers et al. | 327/384 |
| 2005/0135471 | A1 | 6/2005 | Tonietto et al. | |
| 2008/0231324 | A1* | 9/2008 | Liu et al. | 327/12 |

FOREIGN PATENT DOCUMENTS

KR  100715701  5/2007

OTHER PUBLICATIONS

PCT International Search Report dated Apr. 18, 2011, received in corresponding PCT Application No. PCT/KR2010/005876, 2 pgs.
PCT International Preliminary Report on Patentability dated Mar. 6, 2012 and Translation of the Written Opinion mailed Apr. 18, 2011, received in corresponding PCT Application No. PCT/KR2010/005876, 7 pgs.

* cited by examiner

*Primary Examiner* — Dhaval Patel
(74) *Attorney, Agent, or Firm* — Grossman Tucker Perreault & Pfleger, PLLC

(57) ABSTRACT

A clock and data recovery circuit is disclosed. The clock and data recovery circuit in accordance with an embodiment of the present invention uses a hybrid phase detector that is constituted by including a linear phase detector and a binary phase detector. Since the clock and data recovery circuit basically is constituted with the linear phase detector, a charge pump, a loop filter, a voltage controlled oscillator and a D flip flop to recover clock and data, a phase detector gain is irrelevant to the jitter of received data and recovered clock, and it is possible to make a fine adjustment of the size of up/down currents of the charge pump using the binary phase detector and a charge pump controller, thereby compensating a phase offset between the received data and the recovered clock.

7 Claims, 3 Drawing Sheets

US 8,699,649 B2

CLOCK AND DATA RECOVERY CIRCUIT

CROSS-REFERENCE TO RELATED APPLICATIONS

This application is a continuation of PCT/KR2010/005876 filed Aug. 31, 2010, which claims the benefit of Korean Patent Application No. 10-2009-0080889, filed with the Korean Intellectual Property Office on Aug. 31, 2009, the disclosure of which is incorporated herein by reference in its entirety.

BACKGROUND

1. Technical Field

An embodiment of the present invention relates to a clock and data recovery circuit that recovers a clock from the NRZ (Non-Return-to-Zero) type of non-periodic received data in a high speed serial communication and recovers data using recovered clock signal.

2. Background Art

A typical clock and data recovery circuit generates from an inputted data signal a clock signal that is synchronized to a data signal to recover a data signal and a clock signal. The clock and data recovery circuit is widely used for data transmission in a LAN, wireless/wired communication, optical communication, disk drive, etc.

The clock and data recovery circuit is commonly designed by selecting one phase detector (e.g., a binary phase detector or a linear phase detector). When one phase detector is used, any problem inherent in the phase detector hinders the clock and data recovery circuit from operating properly.

Specifically, in case a binary phase detector is used, the gain of the phase detector is changed according to the jitter of the recovered clock and received data, and in case a linear phase detector is used, the phase offset between the received data and the recovered clock due to a mismatch of up/down currents of a charge pump and other mismatches resulted from various causes is relatively large because of the small gain of the phase detector.

Accordingly, studies have been needed for a clock and data recovery circuit that can allow a constant gain of a phase detector and can compensate for a phase offset between the received data and recovered clock.

SUMMARY

An embodiment of the present invention provides a clock and data recovery circuit in which the gain of a phase detector is constant and the phase offset between received data and recovered clock is small, by realizing the clock and data recovery circuit using a hybrid phase detector.

Contrived to achieve the above object, an embodiment of the present invention provides a clock and data recovery circuit, which includes: a hybrid phase detector configured to output first up/down signals and second up/down signals by comparing phases of received data and recovered clock; a charge pump configured to generate up/down currents corresponding to the first up/down signals inputted from the hybrid phase detector; a charge pump controller configured to generate N bits of digital signal making an adjustment of the size of the up/down currents of the charge pump according to the second up/down signals inputted from the hybrid phase detector; a loop filter configured to output an analog voltage regulation signal corresponding to the up/down currents inputted from the charge pump; a voltage controlled oscillator recovering a clock having a changed frequency and phase according to the analog voltage regulation signal outputted from the loop filter; and a D flip flop configured to output recovered data by sampling the received data with the recovered clock.

DETAILED DESCRIPTION

Figure 1:
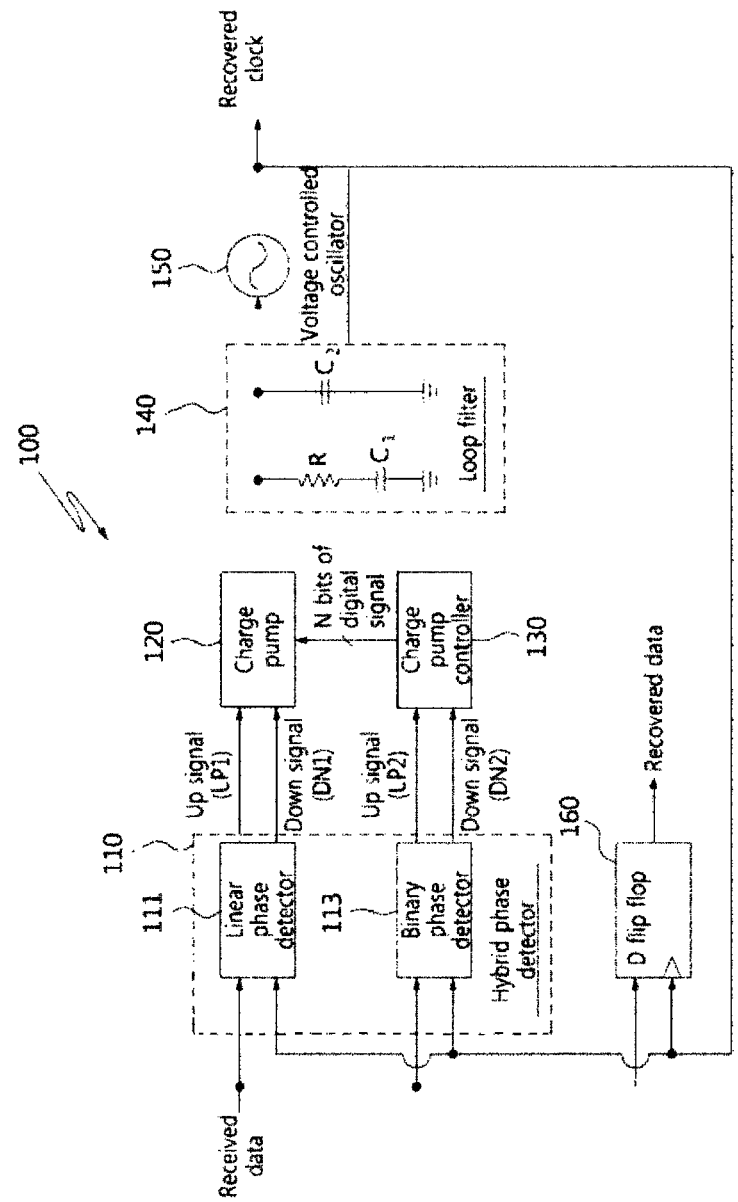
FIG. 1 is a block diagram showing a clock and data recovery circuit that includes a hybrid phase detector in accordance with an embodiment of the present invention.

Hereinafter, a specific embodiment of the present invention will be described with reference to the accompanying drawings. This, however, is provided on illustrative purposes, and the present invention shall not be restricted to what is described herein.

In describing the present invention, any detailed description will be omitted if it is deemed that such description will obscure the gist of the present invention unnecessarily. The terms used hereinafter are defined by considering their functions in the present invention and can be changed according to the intention, convention, etc. of the user or operator. Therefore, the definitions of these terms shall be made based on the overall description of this specification.

The technical ideas of the present invention shall be defined by the appended claims, and the following embodiment shall only be mere means for efficiently describing the technical ideas of the present invention to those who are skilled in the art to which the present invention pertains.

In general, if a binary phase detector is used in a clock and data recovery circuit, the gain ($K_{PD}$) of the phase detector can be expressed in the following Equation 1.

$$K_{PD} = I_{CP}\alpha_T \frac{1}{2\pi} \frac{2T_{bit}}{\sqrt{2\pi}\sqrt{\sigma_1^2 + \sigma_2^2}} \qquad \text{Equation 1}$$

Here, $I_{CP}$ is a size of up/down current of a charge pump, $a_T$ is a data transition rate of received data, $T_{bit}$ is a bit duration of the received data, and $s_1$ and $s_2$ are a standard deviation of jitter of the received data and the recovered clock, respectively.

In general, since $s_1$ and $s_2$ are much smaller than $T_{bit}$, it can be inferred that the gain ($K_{PD}$) of the phase detector is very big. Since the gain ($K_{PD}$) is very big, there is an advantage of small phase offset between the received data and the recovered clock due to mismatch of up/down currents of a charge pump and other mismatches resulted from various causes. However, as seen in Equation 1, the binary phase detector has a shortcoming of the gain ($K_{PD}$) of the phase detector that is changed by the jitter of the received data and the recovered clock.

If a linear phase detector is used in a clock and data recovery circuit, the gain ($K_{PD}$) of the phase detector can be expressed in the following Equation 2.

$$K_{PD} = I_{CP}\alpha_T \frac{1}{2\pi} \qquad \text{Equation 2}$$

Here, $I_{CP}$ is a size of up/down current of a charge pump, and $a_T$ is a data transition rate of received data.

As it can be seen in Equation 2, it can be inferred that, unlike the binary phase detector, the linear phase detector has an advantage that its phase detector gain ($K_{PD}$) is irrelevant to the jitter of received data and recovered clock but the phase detector gain ($K_{PD}$) is much smaller than that of the binary phase detector. Due to the small gain ($K_{PD}$), the linear phase detector has a shortcoming that the phase offset between the received data and the recovered clock due to mismatch of up/down currents of a charge pump and other mismatches resulted from various causes is relatively large.

Described hereinafter will be the configuration of a clock and data recovery circuit having a phase detector gain that is irrelevant to the jitter of received data and recovered clock and compensating for phase offset between the received data and the recovered clock, by using a hybrid phase detector including the linear phase detector and the binary phase detector in the clock and data recovery circuit in accordance with an embodiment of the present invention.

FIG. 1 is a block diagram showing a clock and data recovery circuit that includes a hybrid phase detector in accordance with an embodiment of the present invention.

Referring to FIG. 1, a clock and data recovery circuit 100 in accordance with an embodiment of the present invention is constituted by including a hybrid phase detector 110, a charge pump 120, a charge pump controller 130, a loop filter 140, a voltage controlled oscillator 150 and a D flip flop 160.

The hybrid phase detector 110 is constituted with a linear phase detector 111 and a binary phase detector 113, each of which receives and compares received data and recovered clock to output up/down signals.

Specifically, the linear phase detector 111 compares phases of the received data and the recovered clock and outputs first up/down signals (UP1/DN1), corresponding to a difference of the phases, to the charge pump 120, which is described below. The binary phase detector 113 compares the phases of the received data and the recovered clock and outputs a second up signal (UP2), if the phase of the received data is ahead of the phase of the recovered clock, and a second down signal (DN2), if the phase of the received data is behind the phase of the recovered clock, to the charge pump controller 130, which is described below. As such, in an embodiment of the present invention, the linear phase detector 111 and the binary phase detector 113 will be included when referring to the hybrid phase detector 110.

The charge pump 120 receives the first up/down signals (UP1/DN1) inputted from the linear phase detector 111 of the hybrid phase detector 110 and generates up/down currents corresponding to the first up/down signals (UP1/DN1). Here, the charge pump 120 is inputted with N bits of digital signal from the charge pump controller 130, which will be described later, and makes a fine adjustment of the size of the up/down currents. The detailed configuration of the charge pump 120 will be described later with reference to FIG. 2.

The charge pump controller 130 generates N bits of digital signal that makes a fine adjustment of the size of the up/down currents of the charge pump 120 according to the second up/down signals (UP2/DN2) inputted from the binary phase detector 113 of the hybrid phase detector 110. The detailed configuration of the charge pump controller 130 will be described later with reference to FIG. 3.

As such, by making a fine adjustment of the size of the up/down currents of the charge pump 120 using the binary phase detector 113 and the charge pump controller 130, the phase offset between the received data and the recovered clock can be compensated.

The loop filter 140 outputs an analog voltage regulation signal corresponding to the up/down currents inputted from the charge pump 120. Specifically, the loop filter 140 is constituted with a resistor (R) and a first capacitor (C1), which are serially connected between an output terminal of the charge pump 120 and a ground, and a second capacitor (C2), which is connected between the output terminal of the charge pump 120 and a ground. As such, the up/down current outputted from the charge pump 120 passes through the loop filter 140 to be changed to regulation voltage of the voltage controlled oscillator 150, which is described below.

The voltage controlled oscillator 150 recovers a clock having a changed frequency and phase according to the analog voltage regulation signal outputted from the loop filter 140, and feeds back the recovered clock to the hybrid phase detector 110 and the D flip flop 160, which is described below.

The D flip flop 160 samples the received data with the recovered clock and recovers data.

Figure 2:
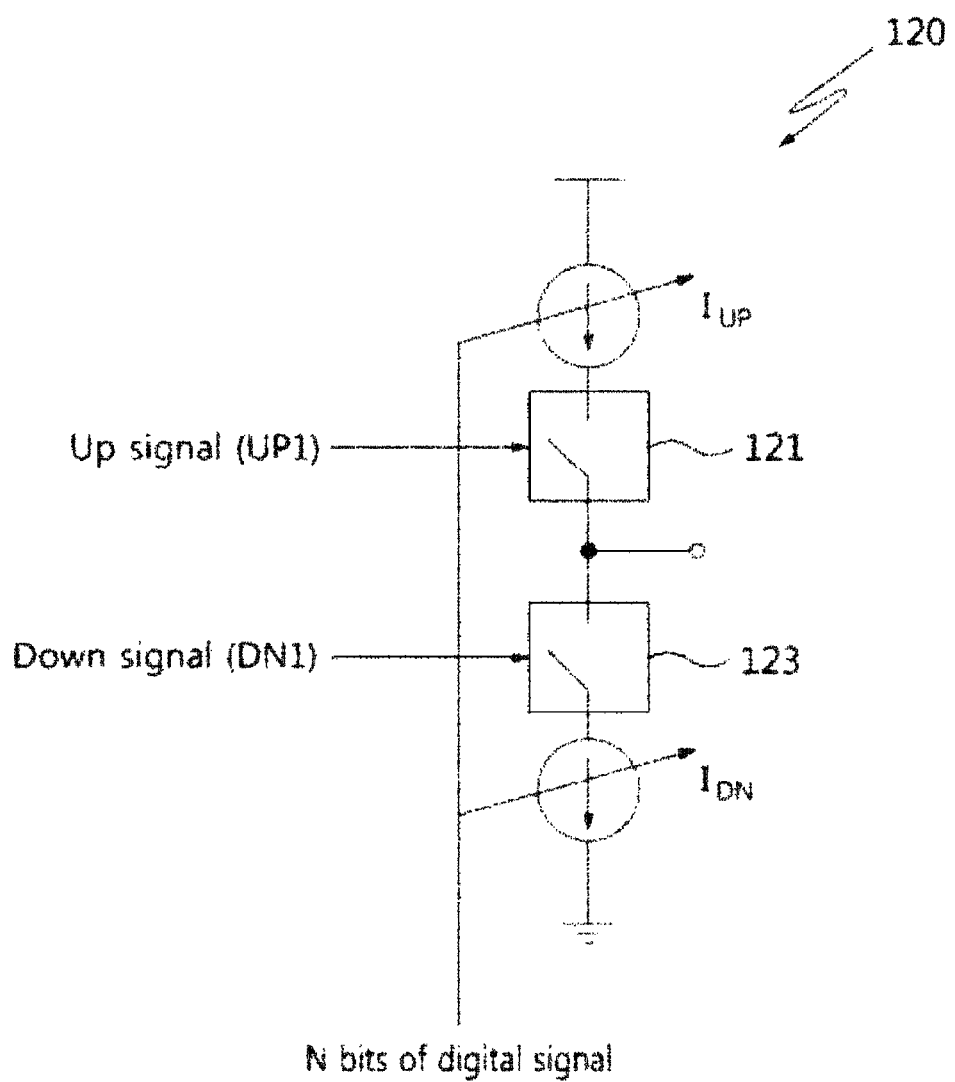
FIG. 2 is a detailed block diagram of a charge pump constituting the clock and data recovery circuit in accordance with an embodiment of the present invention.

FIG. 2 is a detailed block diagram of a charge pump constituting the clock and data recovery circuit in accordance with an embodiment of the present invention.

Referring to FIG. 2, the charge pump 120 is constituted by including an up current source ($I_{UP}$), a down current source ($I_{DN}$), a first switch 121 and a second switch 123. When the charge pump 120 is inputted with the first up signal (UP1) from the linear phase detector 111, the first switch 121 is turned on and the up current ($I_{UP}$) is outputted, and thus a positive charge is built up in the first capacitor (C1) and the second capacitor (C2), thereby increasing an output voltage of the charge pump 120. Moreover, when the charge pump 120 is inputted with the first down signal (DN1) from the linear phase detector 111, the second switch 123 is turned on and a positive charge corresponding to the down current ($I_{DN}$) is removed from the first capacitor (C1) and the second capacitor (C2) of the loop filter 140, thereby decreasing the output voltage of the charge pump 120.

It is possible that the charge pump 120 is inputted with N bits of digital signal from the charge pump controller 130 while the size of the up current source ($I_{UP}$) is fixed to make a fine adjustment of the size of the down current source ($I_{DN}$), is inputted with N bits of digital signal from the charge pump controller 130 while the size of the down current source ($I_{DN}$) is fixed to make a fine adjustment of the size of the up current source ($I_{UP}$), or is inputted with N bits of digital signal from the charge pump controller 130 to make a fine adjustment of the size of both the up current source ($I_{UP}$) and the down current source ($I_{DN}$). As such, by making a fine adjustment of the size of the up/down current sources ($I_{UP}$, $I_{DN}$) of the charge pump 120 through the binary phase detector 113 and the charge pump controller 130, the phase offset between the received data and the recovered clock can be compensated. Here, the current source of the up/down current sources ($I_{UP}$, $I_{DN}$) for which the fine adjustment is to be made can be variously configured according to the design goal, surrounding circuits and designer's experience, and it is not restricted to any of the current sources.

Figure 3:
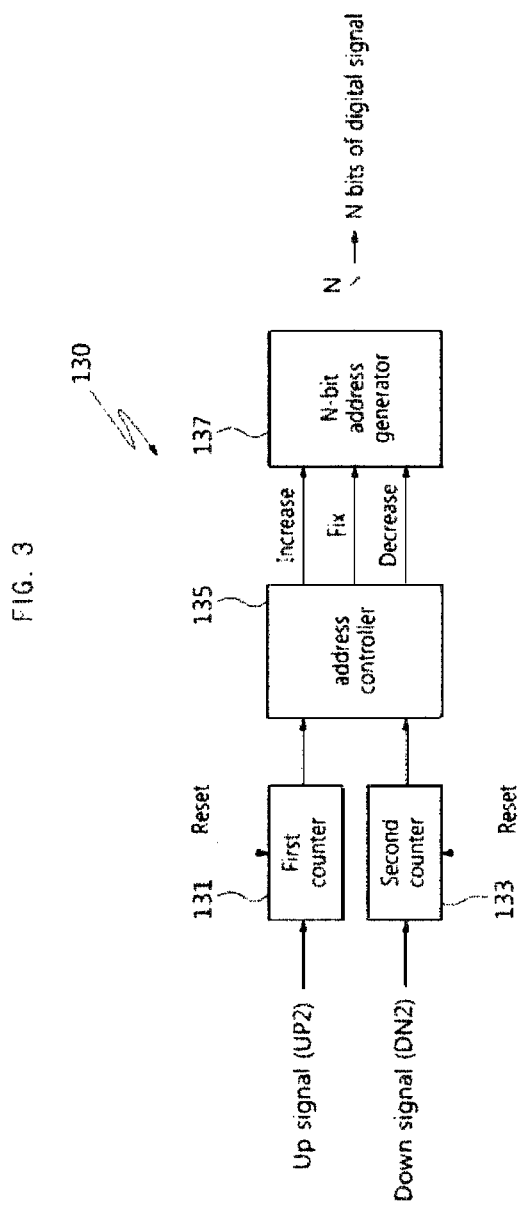
FIG. 3 is a detailed block diagram of a charge pump controller constituting the clock and data recovery circuit in accordance with an embodiment of the present invention.

FIG. 3 is a detailed block diagram of a charge pump controller constituting the clock and data recovery circuit in accordance with an embodiment of the present invention.

Referring to FIG. 3, the charge pump controller 130 is constituted by including a first counter 131, a second counter 133, an address controller 135 and an N-bit address generator 137.

The first counter 131 counts the number of the second up signals (UP2) inputted from the binary phase detector 113, and the second counter 133 counts the number of the second down signals (DN2) inputted from the binary phase detector 113.

The address controller 135 is inputted with the numbers of the second up signals (UP2) and the second down signals (DN2) from the first counter 131 and the second counter 133, respectively, and outputs one of "Increase," "Decrease" and "Fix" signals if at least one of the two numbers is equal to a natural number predetermined at the time of design, and outputs a "Reset" signal to the first and second counters 131, 133. The first and second counters 131, 133 that are inputted with the Reset signal reset their counter values and count the number of the second up/down signals (UP2, DN2) again, respectively.

For example, if it is assumed that the value of the natural number predetermined in the address controller 135 is 100 and that if the number of the second up signals (UP2) counted by the first counter 131 is 100 and the number of the second down signals (DN2) counted by the second counter 133 is 70, the natural number preconfigured in the address controller 135 and the number of the second up signals (UP2) are identical to be 100, and the "Increase" signal is outputted. By contrast, if the number of the second up signals (UP2) is 70 and the number of the second down signals (DN2) is 100, the natural number preconfigured in the address controller 135 and the number of the second down signals (DN2) is identical to be 100, and the "Decrease" signal is outputted. Moreover, if the numbers of the second up signals (UP2) and the second down signals (DN2) are both 100, the "Fix" signal is outputted.

The N-bit address generator 137 generates N bits of digital signal according to any one of the "Increase," "Decrease" and "Fix" signals from the address controller 135. For example, if the "Increase" signal is inputted, the N bits of digital signal is increased by an amount predetermined at the time of design, and if the "Decrease" signal is inputted, the N bits of digital signal is decreased by an amount predetermined at the time of design. If the "Fix" signal is inputted, the N bits of digital signal is fixed.

As such, by changing the N bits of digital signal generated by the charge pump controller 130 according to the second up/down signals (UP2, DN2) inputted from the binary phase detector 113, it is possible to make a fine adjustment of the size of the up/down current sources ($I_{UP}$, $I_{DN}$) in the charge pump 120.

Since the clock and data recovery circuit 100 in accordance with an embodiment of the present invention basically is constituted with the linear phase detector 111, the charge pump 120, the loop filter 140, the voltage controlled oscillator 150 and the D flip flop 160 to recover the clock and data, the phase detector gain is irrelevant to the jitter of the received data and recovered clock. Moreover, by making a fine adjustment of the size of up/down currents of the charge pump 120 using the binary phase detector 113 and the charge pump controller 130, the phase offset between the received data and the recovered clock is compensated.

Furthermore, the hybrid phase detector 110 of the clock and data recovery circuit 100 in accordance with an embodiment of the present invention is irrelevant to the structures of the linear phase detector 111 and the binary phase detector 113 (for example, full-rate linear phase detector, half-rate linear phase detector, quarter-rate linear phase detector, full-rate binary phase detector, half-rate binary phase detector, quarter-rate binary phase detector, etc.) and thus can be realized in any structure.

Although the present invention has been described through a certain embodiment, it shall be appreciated that various permutations and modifications of the described embodiment are possible by those who are skilled in the art to which the present invention pertains without departing from the scope of the invention.

Therefore, the scope of the present invention shall not be defined by the described embodiment but shall be defined by the appended claims and their equivalents.

What is claimed is:

1. A clock and data recovery circuit, comprising:
a hybrid phase detector configured to output first up/down signals and second up/down signals by comparing phases of received data and recovered clock;
a charge pump configured to generate up/down currents corresponding to the first up/down signals inputted from the hybrid phase detector;
a charge pump controller configured to generate N bits of digital signal making an adjustment of the size of the up/down currents of the charge pump according to the second up/down signals inputted from the hybrid phase detector;
a loop filter configured to output an analog voltage regulation signal corresponding to the up/down currents inputted from the charge pump;
a voltage controlled oscillator recovering a clock having a changed frequency and phase according to the analog voltage regulation signal outputted from the loop filter; and
a D flip flop configured to output recovered data by sampling the received data with the recovered clock,
wherein the hybrid phase detector comprises:
a linear phase detector configured to output the first up/down signals to the charge pump by comparing the phases of the received data and the recovered clock; and
a binary phase detector configured to output the second up/down signals to the charge pump controller by comparing the phases of the received data and the recovered clock.

2. The clock and data recovery circuit of claim 1, wherein the charge pump comprises an up current source and a down current source, and
wherein the size of the up current source is fixed, and the size of the down current source is adjusted by being inputted with the N bits of digital signal from the charge pump controller.

3. The clock and data recovery circuit of claim 1, wherein the charge pump comprises an up current source and a down current source, and
wherein the size of the down current source is fixed, and the size of the up current source is adjusted by being inputted with the N bits of digital signal from the charge pump controller.

4. The clock and data recovery circuit of claim 1, wherein the charge pump comprises an up current source and a down current source, and
wherein the sizes of both the up current source and the down current source are adjusted by being inputted with the N bits of digital signal from the charge pump controller.

5. The clock and data recovery circuit of claim 1, wherein the charge pump controller comprises:

a first counter configured to count the number of the second up signals inputted from the binary phase detector;

a second counter configured to count the number of the second down signals inputted from the binary phase detector;

an address controller configured to be inputted with the numbers of the second up signals and the second down signals from the first counter and the second counter, respectively, and to output one of "Increase," "Decrease" and "Fix" signals if at least one of the two numbers is equal to a predetermined natural number, and to output a "Reset" signal to the first and second counters; and an N-bit address generator configured to generate N bits of digital signal according to any one of the "Increase," "Decrease" and "Fix" signals inputted from the address controller and to input the N bits of digital signal to the charge pump.

6. The clock and data recovery circuit of claim 5, wherein the N-bit address generator is configured to increase the N bits of digital signal by a predetermined amount if the "Increase" signal is inputted from the address controller, to decrease the N bits of digital signal by a predetermined amount if the "Decrease" signal is inputted from the address generator, and to fix the N bits of digital signal if the "Fix" signal is inputted from the address generator.

7. The clock and data recovery circuit of claim 5, wherein the first and second counters are configured to reset counter values if the "Reset" signal is inputted from the address controller and to count the number of the second up/down signals again, respectively.

\* \* \* \* \*